(12) United States Patent
Tseng et al.

(10) Patent No.: US 8,849,001 B2
(45) Date of Patent: Sep. 30, 2014

(54) VOXEL-BASED TRANSFORMATION METHOD FOR TRANSFORMING DIFFUSION MRI DATA AND GROUPS TEST METHOD USING THE SAME

(75) Inventors: Isaac Wen-Yih Tseng, Taipei (TW); Fang-Cheng Yeh, Taipei (TW)

(73) Assignee: National Taiwan University, Taipei (TW)

( * ) Notice: Subject to any disclaimer, the term of this patent is extended or adjusted under 35 U.S.C. 154(b) by 228 days.

(21) Appl. No.: 13/524,704

(22) Filed: Jun. 15, 2012

(65) Prior Publication Data

US 2013/0259340 A1 Oct. 3, 2013

(30) Foreign Application Priority Data

Apr. 3, 2012 (TW) .............................. 101111842 A

(51) Int. Cl.
*G06K 9/00* (2006.01)
(52) U.S. Cl.
USPC ......................................................... 382/131
(58) Field of Classification Search
None
See application file for complete search history.

(56) References Cited

PUBLICATIONS

Yeh, Fang-Cheng, and Wen-Yih Isaac Tseng. "NTU-90: a high angular resolution brain atlas constructed by q-space diffeomorphic reconstruction." NeuroImage 58.1 (Jun. 16, 2011): 91-99.*

* cited by examiner

*Primary Examiner* — Nirav G Patel
(74) *Attorney, Agent, or Firm* — SmithAmunden LLC; Kelly J. Smith; Dennis S. Schell

(57) ABSTRACT

A voxel-based transformation method includes: a) obtaining a MRI dataset in a subject space associated with subject voxel coordinates, subject sampling directions, and subject voxel spin amounts, and a dataset of a co-registration template associated with template voxel coordinates, each subject voxel coordinate corresponding to a template voxel coordinate according to a mapping function; b) through an inverse of the mapping function, obtaining subject voxel coordinates and a Jacobian matrix; and c) obtaining template voxel spin amounts, each being a function of a template sampling direction and a template voxel coordinate, using the Jacobian matrix and image data.

12 Claims, 4 Drawing Sheets
(1 of 4 Drawing Sheet(s) Filed in Color)

---

Obtaining a Subject MRI Dataset in a Subject Space and a Dataset of a Co-registration Template in a Template Space — S16

Obtaining the Subject Voxel Coordinates That Correspond to the Template Voxel Coordinates, and Obtaining a Jacobian Matrix — S17

Obtaining Template Voxel Spin Amounts through a q-space Distribution Reconstruction Function — S18

Constructing a Generated Template — S19

VOXEL-BASED TRANSFORMATION METHOD FOR TRANSFORMING DIFFUSION MRI DATA AND GROUPS TEST METHOD USING THE SAME

CROSS-REFERENCE TO RELATED APPLICATION

This application claims priority to Taiwanese Application No. 101111842, filed on Apr. 3, 2012.

BACKGROUND OF THE INVENTION

1. Field of the Invention

The invention relates to a voxel-based transformation method, and more particularly to a voxel-based transformation method for a magnetic resonance imaging dataset.

2. Description of the Related Art

Diffusion MRI is a non-invasive imaging method suitable for evaluating fiber orientation of a specific region and revealing the underlying white matter structure of the human brain. By using the diffusion tensor model, diffusion MRI can be used to reconstruct diffusion tensor imaging (DTI), which has been used to study the fiber orientations and the quantitative measurement of the diffusion characteristics. The axonal connections in the human brain can also be assessed by applying streamline fiber tracking on DTI data.

However, DTI is based on an assumption that each voxel has only one nerve fiber, and therefore has the following limitations: difficulty in resolving crossing fibers and the partial volume effect, which leads to inaccurate estimation of anisotropy index at fiber crossing regions.

The crossing fiber limitation could be solved by using an orientation distribution function (ODF) to characterize the diffusion distribution. The diffusion images can be acquired by using high angular resolution diffusion image (HARDI) acquisition, or by using diffusion spectrum imaging (DSI) acquisition. Reconstruction methods include q-ball imaging (QBI) and DSI, which model diffusion distribution by a probability based approach and calculate diffusion ODFs, so as to obtain the fiber structure.

Although fiber crossing can be resolved using HARDI acquisition, one recent study showed that the generalized fractional anisotropy (GFA) offered by QBI is also vulnerable to the partial volume effect of crossing fibers, indicating that studies using ODF to characterize diffusion distribution may also suffer from the partial volume effect. This result can be explained by the fact that the ODF of the diffusion distribution (e.g., diffusion ODF) or fiber volume fraction (e.g., fiber orientation distribution, FOD) are fractional values, not the actual amount of the diffusion spins. The partial occupation of the crossing fibers or background diffusion will inevitably change the fractional values, leading to a consequence known as the partial volume effect.

Although the aforesaid methods for reconstructing the fiber orientation have been developed to a certain extent, they are still not good enough to reconstruct the fiber structure of an individual. Study and analysis of brain often need to transform data of the subjects to a standard space (e.g., template space) using a co-registration template to perform a linear or a non-linear diffeomorphic co-registration, so as to compare difference therebetween. Another method is to transform two data groups to the template space according to the same co-registration template to perform statistics analysis. In addition to comparing differences, a generated template related to multiple subjects can be constructed by averaging data of the subjects in the template space. The generated template is a new template integrating the aforesaid transformed MRI data of multiple subjects and including data of fiber orientation. This method may provide overall information of a human brain, and may play an important role in study of brain connectome.

To provide reliable overall information of the subjects is related to correct analysis of the fiber orientations from the generated template of the subjects, and to provide compatible quantitative analysis result.

Conventional developed methods of constructing a generated template related to multiple subjects are based on DTI. For further employing a method based on ODF in spatial transformation technique, it has been proposed to use HARDI to obtain transformed FOD. However, this method is limited by linear transformation, and the transformed FOD cannot provide an anisotropy index for quantitative analysis.

This problem is even more challenging when nonlinear transformation is applied to the ODF. The transformation may contain scaling and shearing that alter the fractional measurement of the diffusion spins and cause difficulties in transforming an ODF to the template space.

SUMMARY OF THE INVENTION

Therefore, an object of the present invention is to provide a voxel-based transformation method for a magnetic resonance imaging (MRI) dataset that may provide more precise fiber orientation and that is capable of quantitative analysis.

According to one aspect of the present invention, a method comprises:

a) obtaining a subject MRI dataset in a subject space and a dataset of a co-registration template in a template space, the subject MRI dataset being associated with a plurality of subject voxel coordinates, a plurality of subject sampling directions, and a plurality of subject voxel spin amounts, each of which is a function of one of the subject voxel coordinates and one of the subject sampling directions, the dataset of the co-registration template being associated with a plurality of template voxel coordinates, each of the subject voxel coordinates corresponding to one of the template voxel coordinates in the template space according to a mapping function of a co-registration method;

b) through an inverse of the mapping function, obtaining one of the subject voxel coordinates of the subject MRI dataset that corresponds to one of the template voxel coordinates of the co-registration template, and obtaining a Jacobian matrix associated with the obtained one of the subject voxel coordinates and the corresponding one of the template voxel coordinates; and c) through a q-space distribution reconstruction (QSDR) function, obtaining a template voxel spin amount which is a function of a template sampling direction and the corresponding one of the template voxel coordinates using the Jacobian matrix and image data at said one of the subject voxel coordinates obtained in step b).

Another object of the present invention is to provide a group test method based on the aforesaid voxel-based transformation method.

According to another aspect of the present invention, a method comprises:

(A) performing transformation on two groups, the two groups including a plurality of subjects, the transformation performed on each of the two groups including the following sub-steps:

(i) obtaining a subject MRI dataset in a subject space and a dataset of a co-registration template in a template space, the subject MRI dataset being associated with a plurality of subject voxel coordinates, a plurality of subject sampling directions, and a plurality of subject voxel spin amounts, each of which is a function of one of the subject voxel coordinates and one of the subject sampling directions, the dataset of the co-registration template being associated with a plurality of template voxel coordinates, each of the subject voxel coordinates corresponding to one of the template voxel coordinates in the template space according to a mapping function of a co-registration method;

(ii) through an inverse of the mapping function, obtaining one of the subject voxel coordinates of the subject MRI dataset that corresponds to one of the template voxel coordinates of the co-registration template, and obtaining a Jacobian matrix associated with the obtained one of the subject voxel coordinates and the corresponding one of the template voxel coordinates;

(iii) through a q-space distribution reconstruction (QSDR) function, obtaining a template voxel spin amount which is a function of a template sampling direction and the corresponding one of the template voxel coordinates using the Jacobian matrix and image data at said one of the subject voxel coordinates obtained in sub-step (ii), wherein the template voxel spin amount is obtained for each of the template voxel coordinates;

(iv) calculating fiber orientation at each of the template voxel coordinates according to results obtained in sub-step iii); and (v) calculating quantitative anisotropy (QA), which is defined as amount of spins that undergo diffusion along the fiber orientation; and (B) performing QA test of the two groups to obtain a p-value, which represents significance of QA difference, at each of the template voxel coordinates.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
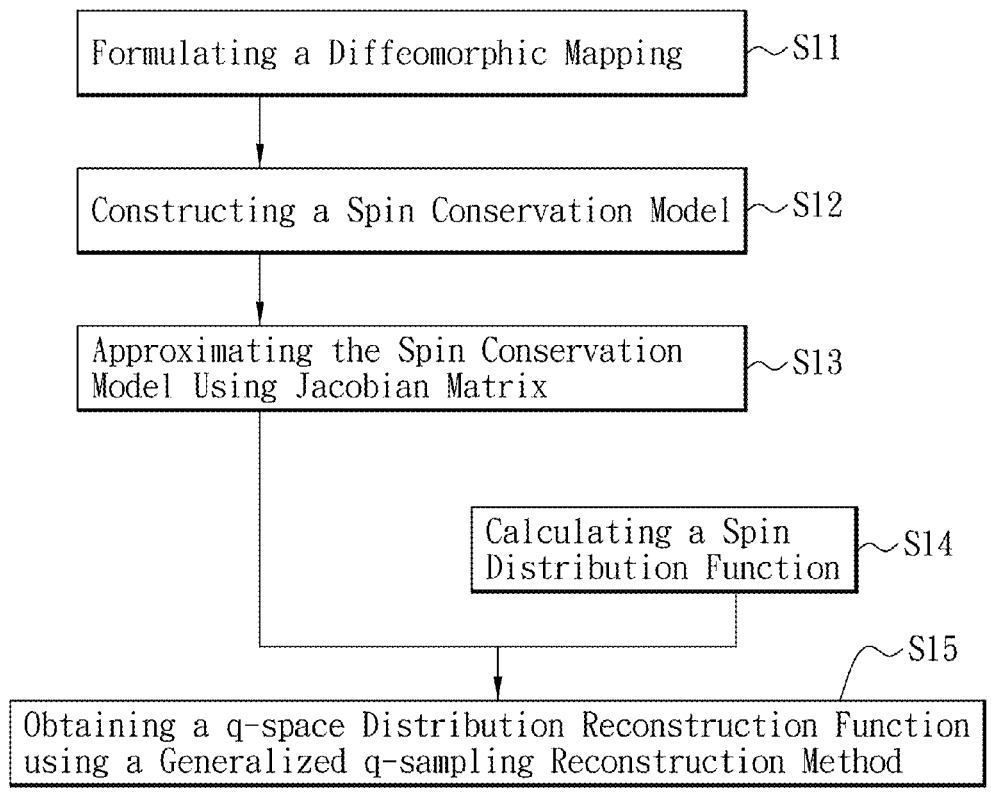
FIG. 1 is a flow chart illustrating a q-space diffeomorphic reconstruction used in the preferred embodiment of a voxel-based transformation method according to the present invention.

In this invention, a high angular resolution brain atlas is constructed in an international consortium for brain mapping-152 (ICBM-152) template space to show an amount of the diffusion spins in different orientations. The constructed atlas is called a generated template in the following description. The generated template uses generalized q-sampling imaging (GQI) to calculate a spin distribution function (SDF). To obtain the SDFs in the ICBM-152 space (called transformed SDF in the following text, as opposed to the original SDF, which is the SDF obtained from GQI without transformation), a method called q-space diffeomorphic reconstruction (QSDR) is proposed herein. The QSDR can calculate transformed SDFs in any given deformation field that satisfies diffeomorphism, and can preserve fiber orientations so that these orientations can be used to conduct fiber tracking. Moreover, this method aims to satisfy the conservation of diffusion spins, and the transformed SDFs can be used for quantitative analysis. The following steps, which are shown in FIG. 1, illustrate the method of the preferred embodiment to construct the QSDR.

Step S11: Diffeomorphic Mapping

Diffeomorphic mapping can be formulated according to the following equation: $\phi(r_s)=r_t$, where $\phi$ is the mapping function ($\phi:R^3 \to R^3$), $r_s$ is a coordinate in the subject space, and $r_t$ is a coordinate in the template space (e.g., the ICBM-152 space). The diffeomorphic mapping can be obtained using a linear or a non-linear co-registration method. Diffeomorphic mapping satisfies two prerequisites: $\phi$ has an inverse function $\phi^{-1}$, and both $\phi$ and $\phi^{-1}$ are differentiable. In other words, for any point $r_s$, there exists a corresponding point $\phi(r_s)$ in the template space, and the Jacobian matrix $J_\phi(r_s)$ can be evaluated at $r_s$. This mapping approach provides a more general model for spatial transformation. For example, it can be used to model linear transformation: $\phi(r_s)=Ar_s+t$, where A is a 3-by-3 matrix and t is the transcoordinate vector, or to model nonlinear mapping: $\phi(r_s)=r_s+\cos(2\pi r_s/R)$, where R is a length constant.

Step S12: Spin Conservation

To obtain the transformed SDF, a concept of "conservation of diffusion spins", which ensures that the amount of the diffusion spins is conserved in the diffeomorphic mapping, is introduced. To formulate this concept, a diffusion pattern in the subject space in terms of a density function $Q_s(r_s, r_s')$, which represents the number of the spins that move from coordinates $r_s$ to coordinates $r_s'$ in a specific diffusion time, is modeled. Similarly, a corresponding density function in the template space as $Q_t(r_t, r_t')$, where $\phi(r_s)=r_t$ and $\phi(r_s')=r_t'$, is modeled. With these notations, the conservation of the diffusion spins is modeled as follows:

$$Q_s(r_s, r_s')dr_s = Q_t(r_t, r_t')dr_t \quad (1)$$

where $dr_s$ and $dr_t$ are differential volume elements at $r_s$ and $r_t$, respectively. In this model, the Jacobian matrix $J_{\phi^{-1}}(r_t)$ can be viewed as a constant value when the spins move from $r_t$ to $r_t'$, (i.e., $J_{\phi^{-1}}(r_t) \approx J_{\phi^{-1}}(r_t')$). This allows replacement of $dr_s/dr_t$ by the Jacobian determinant, $|J_{\phi^{-1}}(r_t)|$, and derivation of the following equation:

$$\text{Step } S13: Q_s(r_s, r_s') = Q_t(r_t, r_t')|J_{\phi^{-1}}(r_t)|^{-1} \quad (2)$$

where $|J_{\phi^{-1}}(r_t)|^{-1}$ is the inverse of the Jacobian determinant of $\phi^{-1}$ at $r_t$, and the subscript $\phi^{-1}$ denotes the inverse function of the diffeomorphic mapping $\phi$. The spin conservation model can be further incorporated into the SDF, as will be described in the following paragraphs.

Step S14: Spin Distribution Function

SDF is defined as the amount of the spins that undergo diffusion in different orientations. By using the density function $Q_s(r_s, r_s')$, the original SDF in the subject space can be calculated as follows:

$$\psi_s(r_s, u) = \int_0^L Q_s(r_s, r_s + ru)dr \qquad (3)$$

where r is a displacement variable that ranges from 0 to the diffusion sampling length L, and u is sampling direction of the SDF. The transformed SDF in the template space, however, has to consider the scaling effect on displacement variable r due to the diffeomorphic mapping. Since a unit distance in the template space may not be equal to the same distance in the subject space, the SDF in the template space is calculated as follows:

$$\psi_t(r_t, v) = \int_0^L Q_t(r_t, r_t + \|J_{\varphi^{-1}}(r_t)v\|^{-1} rv)dr \qquad (4)$$

where $\|J_{\phi^{-1}}(r_t)v\|$ is the vector norm of the transformed vector. The additional term, $\|J_{\phi^{-1}}(r_t)v\|^{-1}$, is added to cancel the scaling effect of the diffeomorphic mapping because the unit distance at $r_t+rv$ is scaled by $\|J_{\phi^{-1}}(r_t+rv)v\|$, which can be approximated by $\|J_{\phi^{-1}}(r_t)v\|$. Incorporating the spin conservation model stated in Eq. (2) into Eq. (4), the SDF calculation in the template space is reformulated as follows:

$$\psi_t(r_t, v) = \int_0^L Q_s(\varphi^{-1}(r_t), \varphi^{-1}(r_t + \|J_{\varphi^{-1}}(r_t)v\|^{-1} rv))|J_{\varphi^{-1}}(r_t)|dr \qquad (5)$$

By using this approximation, the following relation between $\psi_t$ and $\psi_s$ can be derived:

$$\psi_t(r_t, v) = |J_{\varphi^{-1}}(r_t)|\psi_s\left(\varphi^{-1}(r_t), \frac{J_{\varphi^{-1}}(r_t)v}{\|J_{\varphi^{-1}}(r_t)v\|}\right) \qquad (6)$$

To further incorporate Eq. (6) into the q-space reconstruction, a generalized q-sampling reconstruction method (disclosed in U.S. patent application Ser. No. 12/694,429), which formulates the relation between the original SDF and diffusion magnetic resonance (MR) signals, is used as shown in the following equation:

$$\psi_s(r_s, u) = A\sum_i W_i(r_s)\mathrm{sinc}(\sigma\sqrt{6Db_i}\langle g_i, u\rangle) \qquad (7)$$

where A is a constant term for SDF quadrature, and i iterates through all diffusion acquisitions. $W_i(r_s)$ is the diffusion MR signal at $r_s$ acquired when b-value=$b_i$ and diffusion gradient direction=$g_i$. $\sigma$ is the diffusion length ratio that controls percentage of coverage of the diffusion spins. D is diffusivity of the diffusion spins, and $\langle g_i, u\rangle$ is an inner product of the diffusion gradient direction and orientation distribution function (ODF) sampling direction.

Step S15: Combining Eqs. (6) and (7), the equation for the QSDR can be derived as follows:

$$\psi_t(r_t, v) = |J_{\varphi^{-1}}(r_t)|A\sum_i W_i(\varphi^{-1}(r_t))\mathrm{sinc}\left(\sigma\sqrt{6Db_i}\left\langle g_i, \frac{J_{\varphi^{-1}}(r_t)v}{\|J_{\varphi^{-1}}(r_t)v\|}\right\rangle\right) \qquad (8)$$

Eq. (8) is the reconstruction equation for the QSDR method, which directly calculates the transformed SDF in the template space from the diffusion MR signals $W_i$. After Eq. (8) is obtained, mapping operation processing can be performed on any subject MRI dataset.

Figure 2:
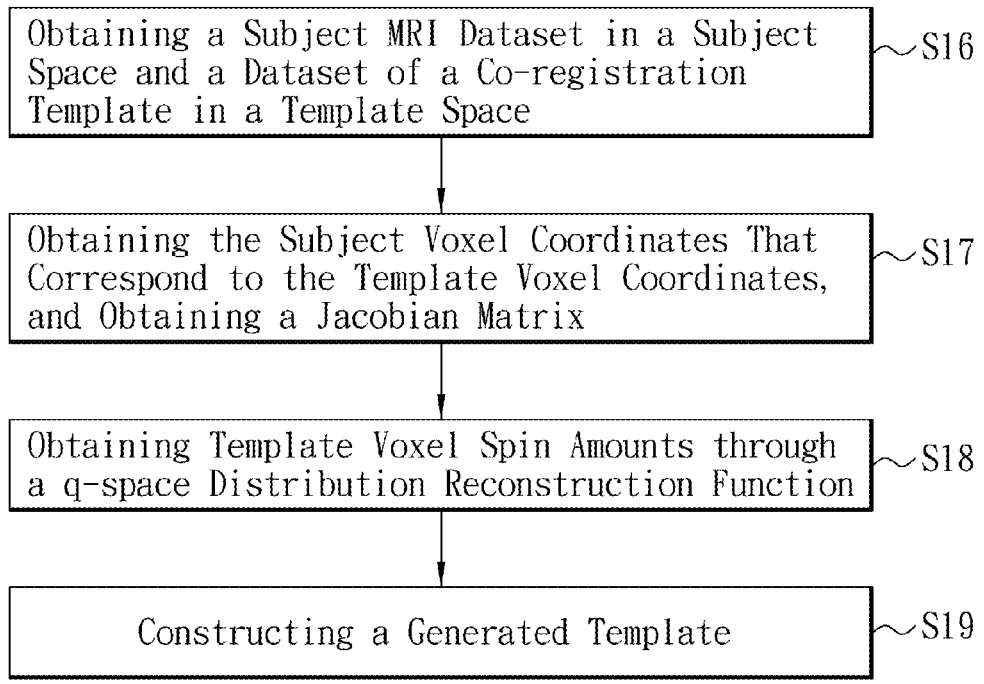
FIG. 2 is a flow chart illustrating construction of a generated template of the preferred embodiment using the voxel-based transformation method according to the present invention.

Referring to FIG. 2, steps of the operation processing are shown as follows.

Step S16: Obtaining a subject MRI dataset in a subject space and a dataset of a co-registration template in a template space (such as ICBM-152 space). The subject MRI dataset is associated with a plurality of subject voxel coordinates $r_s$, a plurality of subject sampling directions u, and a plurality of subject voxel spin amounts $\psi_s(r_s,u)$, each of which is a function of one of the subject voxel coordinates $r_s$ and one of the subject sampling directions u, as shown in Eq. (7). The dataset of the co-registration template is associated with a plurality of template voxel coordinates $r_t$. Each of the subject voxel coordinates corresponds to one of the template voxel coordinates in the template space according to a mapping function of a co-registration method. The function $\phi$ may be obtained using a linear or a non-linear co-registration method.

Step S17: Through an inverse of the mapping function $\phi^{-1}$, obtaining one of the subject voxel coordinates $\phi^{-1}(r_t)$ (one of $r_s$) of the subject MRI dataset that corresponds to one of the template voxel coordinates $r_t$ of the co-registration template, and obtaining a Jacobian matrix $J_{\phi^{-1}}(r_t)$ associated with the obtained one of the subject voxel coordinates $\phi^{-1}(r_t)$ and the corresponding one of the template voxel coordinates $r_t$.

Step S18: Through a q-space distribution reconstruction (QSDR) function (Eq. 8), obtaining a template voxel spin amount $\psi_t(r_t,v)$ which is a function of a template sampling direction v and the corresponding one of the template voxel coordinates $r_t$ using the Jacobian matrix $J_{\phi^{-1}}(r_t)$ and image data at said one of the subject voxel coordinates $\phi^{-1}(r_t)$ obtained in step 17.

Step S19: Generated Template Construction

Figure 3:
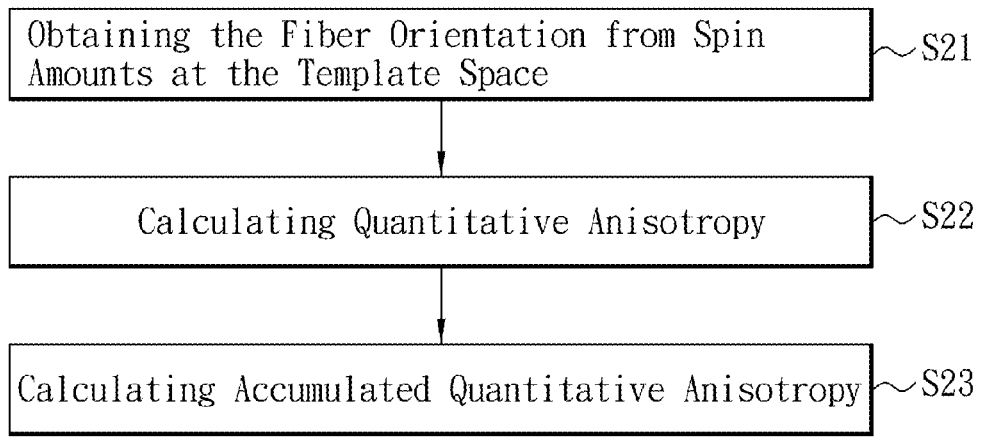
FIG. 3 is a flow chart illustrating a method for calculating accumulated quantitative anisotropy.

A generated template can be constructed by averaging the transformed SDFs of each subject:

$$\bar{\psi}_t(r_t, v) = \frac{1}{n}\sum_{i=1}^n \psi_{t,i}(r_t, v) \qquad (9)$$

where i denotes an $i^{th}$ subject, n is the total number of the subjects, and $\psi_{t,i}$ is the transformed SDF of the $i^{th}$ subject. Since the dataset of the generated template is obtained by directly averaging amounts of the spins at the voxel coordinates $r_t$ of the co-registration template of a plurality of subjects, the voxel coordinates of the dataset of the generated template are the voxel coordinates $r_t$ of the co-registration template, and sampling directions of the dataset of the generated template are the sampling directions v of the dataset of the co-registration template, which are respective coordinates and sampling directions in the template space. It is noted that this direct averaging approach is feasible because the transformed SDF is a quantity-based measure. For measures based on fractional values such as probability or volume fraction, weighted averaging should be used to consider the difference in spin quantities between subjects. The generated template leads to a standard brain with more complete information of the fiber orientation. FIG. 3 further illustrates the following steps of the quantitative analysis.

<Quantitative Analysis>

Step S21: To obtain each amount of the spins $\psi_t(r_t,v)$ at the template space, which means values of the SDF at each coordinate $r_t$ in each sampling direction v. Among values in the different sampling directions v, the local maximum of the SDF defines the orientation of the fiber at the coordinate $r_r$.

Step S22: Quantitative Anisotropy (QA) Calculation

The diffusion characteristics of a fiber population can be analyzed using QA, which is defined as the amount of the spins that undergo diffusion along the fiber orientation:

$$QA(r,\hat{a})=Z_0(\psi(r,\hat{a})-I(\psi(r))) \qquad (10)$$

where $\hat{a}$ is the orientation of the fiber, and $I(\psi(r))$ is the background isotropic component, which can be approximated by the minimum value of the SDF. Z0 is a constant that satisfies $Z_0 I(\psi_0)=1$, where $\psi_0$ is a SDF estimated from a 1 mm³ free water diffusion voxel. It is noted that the calibration needs to be conducted in the subject space, since the volume of the free water diffusion mentioned here is in the subject space.

Step S23: Accumulated QA Calculation

The fiber may span multiple voxels, and the accumulated QA is calculated as follows:

$$\int_R QA(r, \hat{a}(r)) dr \qquad (11)$$

where R is the region occupied by the fiber and $\hat{a}(r)$ is the fiber orientation at coordinate r.

<Fiber Connectivity Analysis>

Figure 4:
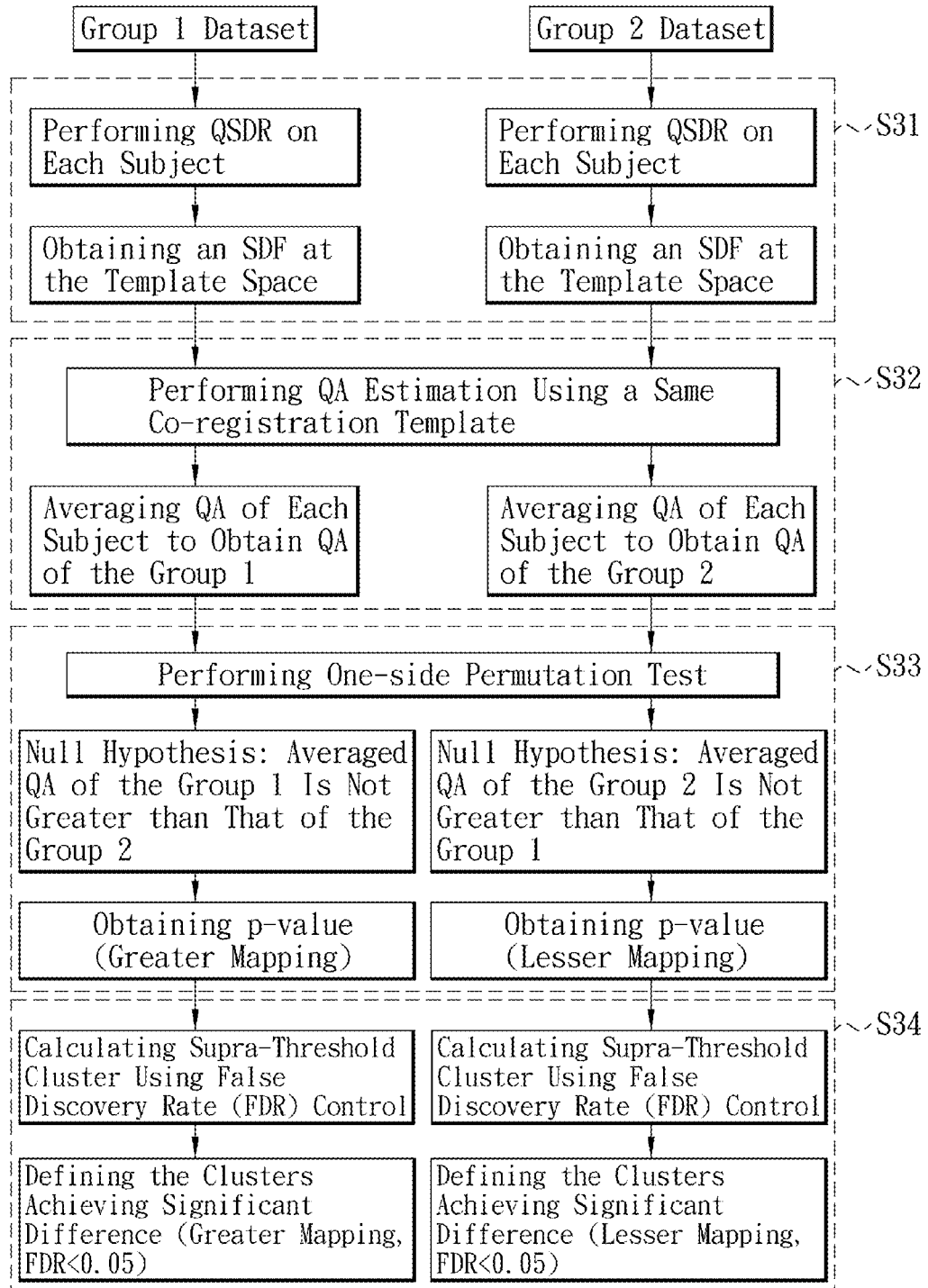
FIG. 4 is a flow chart illustrating a preferred embodiment of the group test method using the voxel-based transformation method for an MRI dataset according to the present invention.
Figure 5:
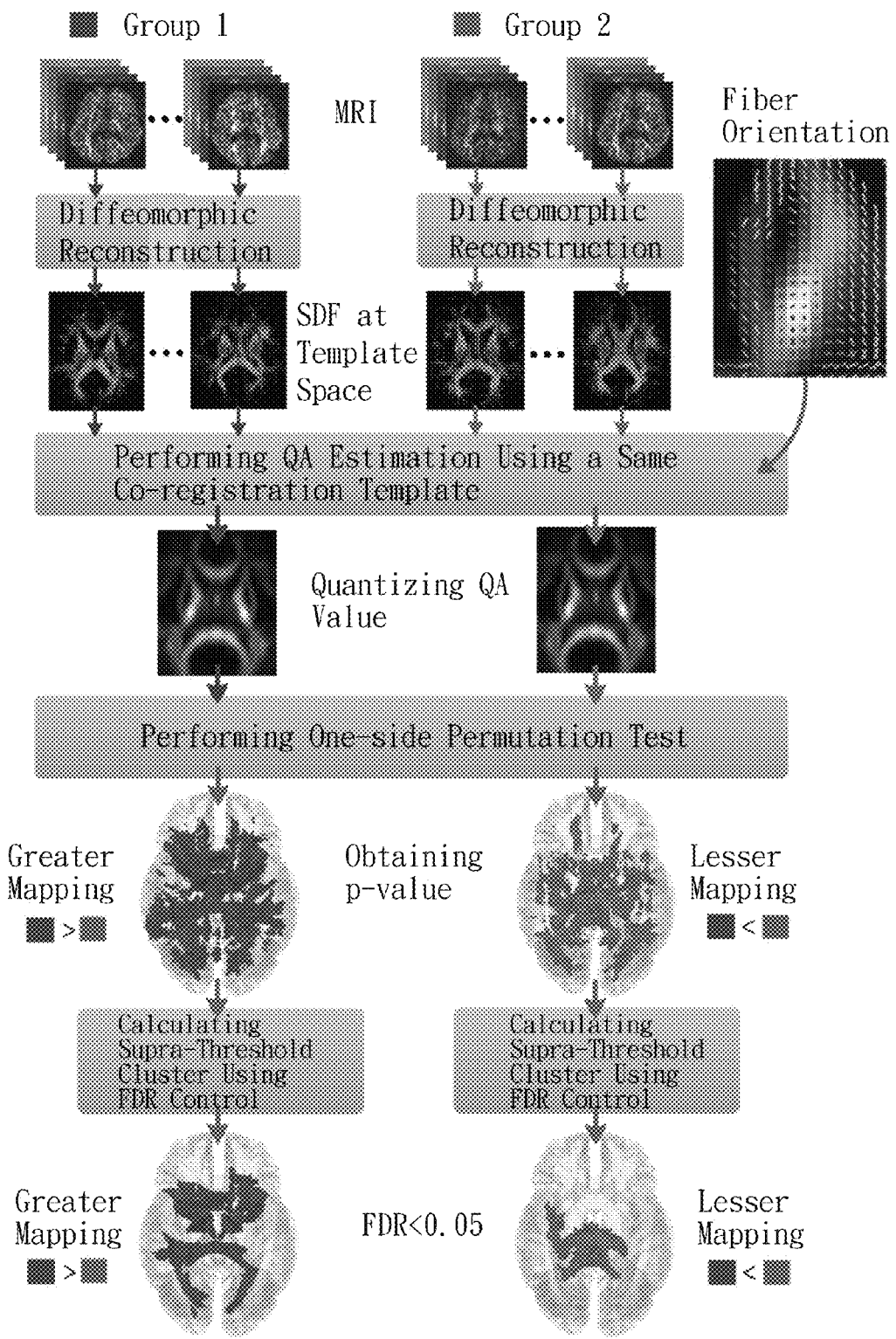
FIG. 5 is a schematic flow chart showing an obtained result using the preferred embodiment.

Referring to FIG. 4 and FIG. 5, the aforesaid techniques were used to analyze the fiber connectometry which is not analyzable in the past, and were applied to a group test. The structural connectivity can be defined as the number of axonal fibers that connect two distinct regions, a definition that views the axonal connections between any two cortical regions as the basic quantification unit of the connectivity. Extending from this definition, a voxel-based structural connectivity, which breaks down the structural connectivity to voxel level and is defined as the number of axonal fibers within a voxel, is proposed. Since a voxel may contain multiple fiber populations at different orientations, each fiber population will have a connectivity value associated therewith. This voxel-based connectivity can be quantified by QA, which is the amount of the diffusible spins that contributes to the anisotropic part of diffusion along the fiber orientation. Therefore, a group test method using a voxel-based connectometry is exemplified with a test on a group 1 and a group 2 as described in the following.

Step S31: To use the aforesaid steps S16~S18 to reconstruct the SDFs on each subject of the group 1 and the group 2. The co-registration template used in step S16 could be a publicly available template, or a generated template obtained from calculation on a population including a plurality of subjects based on steps S16 to S19 in advance.

Step S32: QA Estimation

When the SDFs of each subject in a common template space are reconstructed, the QA values can be estimated using the reconstructed SDFs. The estimation of QA values requires fiber orientations, which are available from publicly available templates, the generated template mentioned in step 31, or a common template obtained by averaging the SDFs over all subjects. Using Eq. (10), each fiber orientation can define a QA value for each subject, and the connectivity difference associated with the fiber orientation can be revealed by the QA distributions of the group 1 and the group 2.

Step S33: Apply Permutation Tests to QA Values

Two null hypotheses are defined to test the significance of the QA difference. One null hypothesis is that the mean QA value of group 1 is not greater than that of group 2, and the resulting p-value mapping is termed the greater mapping. Another null hypothesis is that the mean QA value of group 2 is not greater than that of group 1, and the resulting p-value mapping is termed the lesser mapping. Both parametric (e.g., t-test) and nonparametric tests (e.g., permutation test) can be used to examine these hypotheses, and one-side permutation test is chosen in this embodiment because it can be applied to a small sample size.

Step S34: Supra-Threshold Cluster and False discovery rate control

A p-value threshold is applied to the p-values of the greater and lesser mapping, and fiber orientations that have p-values below the threshold (called positive segments in the following description) are presented. Since the difference in axonal connections tends to continue along the fiber direction, it is expected to see positive segments aligned with the fiber direction, forming a cluster of segments, whereas "false" positive segments may appear randomly in space and orientation, forming sparse fragments. The difference between the actual and false positive segments can be modeled by the size of a cluster. This cluster forming procedure can be conducted by using deterministic fiber tracking algorithm as described in the following.

A seeding point is placed inside a randomly selected voxel that contains a positive segment. The point propagates along the orientation of the positive segment to the neighboring voxel if the neighboring voxel also has a positive segment and the crossing angle between two consecutive positive segments is less than 60 degrees. The connected positive segment in the neighboring voxel is grouped in the same cluster. The propagation is terminated if no positive segment is found or the crossing angle is greater than 60 degrees. The above grouping procedure is repeated 10,000 times to ensure that each positive segment has been considered. Then, the p-value of a cluster can be calculated using the prior distribution of the cluster size. After the p-value is calculated, the clusters achieving significant difference are further determined by FDR control with a predefined threshold (e.g., FDR<0.05). The percentage of the connectivity increase or decrease by using the QA values of the occupying regions may then be estimated.

Referring to FIG. 5, the final result from operation of this invention is a portion where axonal fiber connectivity of the group 1 is obviously greater than that of the group 2 (greater mapping), and a portion where axonal fiber connectivity of the group 1 is obviously less than that of the group 2 (lesser mapping).

<Individual Study>

Voxel-based connectometry can also be applied to individual studies without modifying the processing steps. The study subject is assigned to one group, and its connectivity is compared with a group of normal subjects. The p-value generated from the permutation test can also be used to conduct supra-threshold clustering, and the final result is the connectivity increase and decrease of the study subject in comparison to the normal population.

To sum up, the voxel-based connectometry of this invention and the group test method using the voxel-based connectometry employ the QSDR to obtain the SDF, such that QA analysis may be performed to determine fiber properties, and the methods have excellent performance on both group comparison and individual analysis.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A voxel-based transformation method for a magnetic resonance imaging (MRI) dataset, comprising:
   a) obtaining a subject MRI dataset in a subject space and a dataset of a co-registration template in a template space, the subject MRI dataset being associated with a plurality of subject voxel coordinates, a plurality of subject sampling directions, and a plurality of subject voxel spin amounts, each of which is a function of one of the subject voxel coordinates and one of the subject sampling directions, the dataset of the co-registration template being associated with a plurality of template voxel coordinates, each of the subject voxel coordinates corresponding to one of the template voxel coordinates in the template space according to a mapping function of a co-registration method;
   b) through an inverse of the mapping function, obtaining one of the subject voxel coordinates of the subject MRI dataset that corresponds to one of the template voxel coordinates of the co-registration template, and obtaining a Jacobian matrix associated with the obtained one of the subject voxel coordinates and the corresponding one of the template voxel coordinates; and
   c) through a q-space distribution reconstruction (QSDR) function, obtaining a template voxel spin amount which is a function of a template sampling direction and the corresponding one of the template voxel coordinates using the Jacobian matrix and image data at said one of the subject voxel coordinates obtained in step b).

2. The method as claimed in claim 1, further comprising:
   d) performing step a) to step c) on a plurality of subjects, followed by averaging the template voxel spin amounts at the respective template voxel coordinate and the respective template sampling direction of the subjects to obtain a generated dataset, and constructing a generated template according to the generated dataset.

3. The method as claimed in claim 2, wherein the generated template is calculated according to:

$$\overline{\psi}_t(r_t, v) = \frac{1}{n}\sum_{i=1}^{n} \psi_{t,i}(r_t, v),$$

where $\psi_t(r_t,v)$ is the template voxel spin amount at the respective template voxel coordinate ($r_t$) and the respective template sampling direction (v), i denotes an $i^{th}$ subject, and n is a total number of the subjects.

4. The method as claimed in claim 1, wherein, in step c), the template voxel spin amount is obtained for each of the template voxel coordinates, the method further comprising the following steps after step c):
   e) calculating fiber orientation at each of the template voxel coordinates according to results obtained in step c); and
   f) calculating quantitative anisotropy (QA), which is defined as amount of spins that undergo diffusion along the fiber orientation.

5. The method as claimed in claim 4, further comprising the following step after step f):
   g) calculating accumulated QA for each fiber orientation.

6. The method as claimed in claim 5, wherein the accumulated QA is calculated as:

$$\int_R QA(r, \hat{a}(r))dr$$

where R is the region occupied by the fiber and $\hat{a}(r)$ is the fiber orientation at coordinate r.

7. The method as claimed in claim 1, wherein the template voxel spin amount satisfies:

$$\psi_t(r_t, v) = |J_{\varphi^{-1}}(r_t)|\psi_s\left(\varphi^{-1}(r_t), \frac{J_{\varphi^{-1}}(r_t)v}{\|J_{\varphi^{-1}}(r_t)v\|}\right)$$

where $\psi_t(r_t,v)$ is the template voxel spin amount at the respective template voxel coordinate ($r_t$) and the respective template sampling direction (v), $\phi^{-1}$ denotes an inverse function of diffeomorphic mapping $\phi$, $|J_{\phi^{-1}}(r_t)|$ is a Jacobian determinant of $\phi^{-1}$ at $r_t$, $\psi_s$ is an original spin distribution function (SDF) in the subject space, and $\|J_{\phi^{-1}}(r_t)v\|$ is a vector norm of a transformed vector $J_{\phi^{-1}}(r_t)v$.

8. The method as claimed in claim 1, wherein the QSDR function is:

$$\psi_t(r_t, v) = |J_{\varphi^{-1}}(r_t)|A\sum_i W_i(\varphi^{-1}(r_t))\mathrm{sinc}\left(\sigma\sqrt{6Db_i}\left\langle g_i, \frac{J_{\varphi^{-1}}(r_t)v}{\|J_{\varphi^{-1}}(r_t)v\|}\right\rangle\right)$$

where $\psi_t(r_t,v)$ is the template voxel spin amount at the respective template voxel coordinate ($r_t$) and the respective template sampling direction (v), $\phi^{-1}$ denotes an inverse function of diffeomorphic mapping $\phi$, $|J_{\phi^{-1}}(r_t)|$ is a Jacobian determinant of $\phi^{-1}$ at $r_t$, A is a constant term for a spin distribution function (SDF) quadrature, $W_i(\phi^{-1}(r_t))$ is MR data at $\phi^{-1}(r_t)$ acquired when b-value=$b_i$ and diffusion gradient direction=$g_i$, $\sigma$ is a diffusion length ratio that controls percentage of coverage of diffusion spins, D is diffusivity of the diffusion spins, $\|J_{\phi^{-1}}(r_t)v\|$ is a vector norm of transformed vector $J_{\phi^{-1}}(r_t)v$, and $$\left\langle g_i, \frac{J_{\varphi^{-1}}(r_t)v}{\|J_{\varphi^{-1}}(r_t)v\|}\right\rangle$$

is an inner product of $g_i$ and $$\frac{J_{\varphi^{-1}}(r_t)v}{\|J_{\varphi^{-1}}(r_t)v\|}.$$

9. A group test method for magnetic resonance imaging (MRI) analysis, comprising:
   (A) performing transformation on two groups, the two groups including a plurality of subjects, the transformation performed on each of the two groups including the following sub-steps:
      (i) obtaining a subject MRI dataset in a subject space and a dataset of a co-registration template in a template space, the subject MRI dataset being associated with a plurality of subject voxel coordinates, a plurality of subject sampling directions, and a plurality of subject voxel spin amounts, each of which is a function of one of the subject voxel coordinates and one of the subject sampling directions, the dataset of the co-registration template being associated with a plurality of template voxel coordinates, each of the subject voxel coordinates corresponding to one of the template voxel coordinates in the template space according to a mapping function of a co-registration method;

(ii) through an inverse of the mapping function, obtaining one of the subject voxel coordinates of the subject MRI dataset that corresponds to one of the template voxel coordinates of the co-registration template, and obtaining a Jacobian matrix associated with the obtained one of the subject voxel coordinates and the corresponding one of the template voxel coordinates;

(iii) through a q-space distribution reconstruction (QSDR) function, obtaining a template voxel spin amount which is a function of a template sampling direction and the corresponding one of the template voxel coordinates using the Jacobian matrix and image data at said one of the subject voxel coordinates obtained in sub-step (ii), wherein the template voxel spin amount is obtained for each of the template voxel coordinates;

(iv) calculating fiber orientation at each of the template voxel coordinates according to results obtained in sub-step iii); and (v) calculating quantitative anisotropy (QA), which is defined as amount of spins that undergo diffusion along the fiber orientation; and (B) performing QA test of the two groups to obtain a p-value, which represents significance of QA difference, at each of the template voxel coordinates.

10. The group test method as claimed in claim 9, wherein, in sub-step i), the co-registration template is one of a publicly available template and a generated template obtained from calculation of a population including a plurality of subjects, the calculation including:

performing sub-steps i) to iii) on the plurality of subjects, followed by averaging the template voxel spin amounts at the respective template voxel coordinate and the respective template sampling direction of the subjects to obtain a generated dataset, and constructing the generated template according to the generated dataset.

11. The group test method as claimed in claim 9, wherein, in sub-step iv), the fiber orientation is calculated based on one of a publicly available template, a generated template obtained by averaging the template voxel spin amounts obtained for all of the subjects among the two groups, and a generated template obtained by:

performing sub-steps i) to iii) on a plurality of subjects, followed by averaging the template voxel spin amounts at the respective template voxel coordinate and the respective template sampling direction of the subjects to obtain a generated dataset, and constructing the generated template according to the generated dataset.

12. The group test method as claimed in claim 9, further comprising:

(C) calculating a positive segment from results obtained in step (B), the positive segment representing fiber orientations that have p-values below a p-value threshold;

(D) calculating supra-threshold clusters formed by continuous positive segments using a fiber tracking algorithm; and (E) determining clusters having significant difference using false discovery rate (FDR) control.

* * * * *